(12) United States Patent
Mori et al.

(10) Patent No.: US 8,373,276 B2
(45) Date of Patent: Feb. 12, 2013

(54) PRINTED WIRING BOARD AND METHOD FOR MANUFACTURING THE SAME

(75) Inventors: Hiroyuki Mori, Kyoto (JP); Kazushige Kawasaki, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/365,616

(22) Filed: Feb. 3, 2012

(65) Prior Publication Data

US 2012/0132463 A1 May 31, 2012

Related U.S. Application Data

(63) Continuation of application No. 12/573,395, filed on Oct. 5, 2009, now Pat. No. 8,209,856.

(30) Foreign Application Priority Data

Oct. 21, 2008 (JP) ................................. 2008-271265

(51) Int. Cl.
*H01L 23/528* (2006.01)
(52) U.S. Cl. ........ 257/774; 257/692; 257/698; 257/752; 257/775; 257/E23.07; 439/63
(58) Field of Classification Search .................. 257/673, 257/690, 692, 693, 698, 700, 734, 737, 738, 257/748, 750, 751, 752, 774, 775, 778, 779, 257/780, 781, 786, E23.06, E23.062, E23.069, 257/E23.07; 439/55, 63
See application file for complete search history.

(56) References Cited

U.S. PATENT DOCUMENTS

| | | | |
|---|---|---|---|
| 5,656,858 A | 8/1997 | Kondo et al. | |
| 5,926,798 A | 7/1999 | Carter | |
| 6,661,098 B2 * | 12/2003 | Magerlein et al. | 257/777 |
| 6,828,510 B1 | 12/2004 | Asai et al. | |
| 7,786,008 B2 * | 8/2010 | Do et al. | 438/667 |
| 7,969,016 B2 * | 6/2011 | Chen et al. | 257/777 |
| 7,993,983 B1 * | 8/2011 | Lin | 438/127 |
| 8,062,968 B1 * | 11/2011 | Conn | 438/612 |
| 2006/0131728 A1 * | 6/2006 | Salmon | 257/698 |
| 2008/0308308 A1 | 12/2008 | Kobayashi | |
| 2009/0014843 A1 | 1/2009 | Kawashita et al. | |
| 2011/0101524 A1 * | 5/2011 | Camacho et al. | 257/737 |

FOREIGN PATENT DOCUMENTS

| | | |
|---|---|---|
| JP | 10233417 | 9/1998 |
| JP | 10242649 | 9/1998 |
| JP | 2000269271 | 9/2000 |
| JP | 2003037135 | 2/2003 |

* cited by examiner

*Primary Examiner* — Eduardo A Rodela
(74) *Attorney, Agent, or Firm* — Yuanmin Cai (57) ABSTRACT

Embodiments of the present invention provide a printed wiring board in which solder bumps of a mounted semiconductor chip are less prone to be ruptured. The printed wiring board includes a dielectric layer having a main surface and a connecting pad embedded in the dielectric layer. The connecting pad is shaped like a brimmed hat. That is, the connecting pad includes a plate portion whose diameter is larger than that of a contact portion. The main surface of the contact portion is exposed at the main surface of the dielectric layer. Diameter of the contact portion is substantially the same as diameter of an under bump metal at the semiconductor chip side, when mechanical stress is applied, the stress disperses evenly to both of the connecting pad and the under bump metal, and thus rupture is less prone to occur.

5 Claims, 9 Drawing Sheets

PRINTED WIRING BOARD AND METHOD FOR MANUFACTURING THE SAME

CROSS-REFERENCE TO RELATED APPLICATION

The present application claims the benefit of priority of a Japanese Patent Application No. 2008-271265, filed Oct. 21, 2008 with the Japan Patent Office, the content of which is incorporated herein by reference in its entirety, and is a continuation of U.S. patent application Ser. No. 12/573,395, filed Oct. 5, 2009.

FIELD OF THE INVENTION

The present invention relates to a printed wiring board and a method for manufacturing the same, and more specifically, to a coreless substrate having no core substrate, a semiconductor package, and a method for manufacturing the same.

BACKGROUND OF THE INVENTION

U.S. Pat. No. 5,926,798 (Patent Document 1) discloses a flip-chip mount technology using a controlled collapse chip connection (C4) technology. This technology is a method for mounting a semiconductor chip (IC chip) on a printed wiring board. A semiconductor chip to be mounted has an array of a large number of solder bumps.

Figure 14:
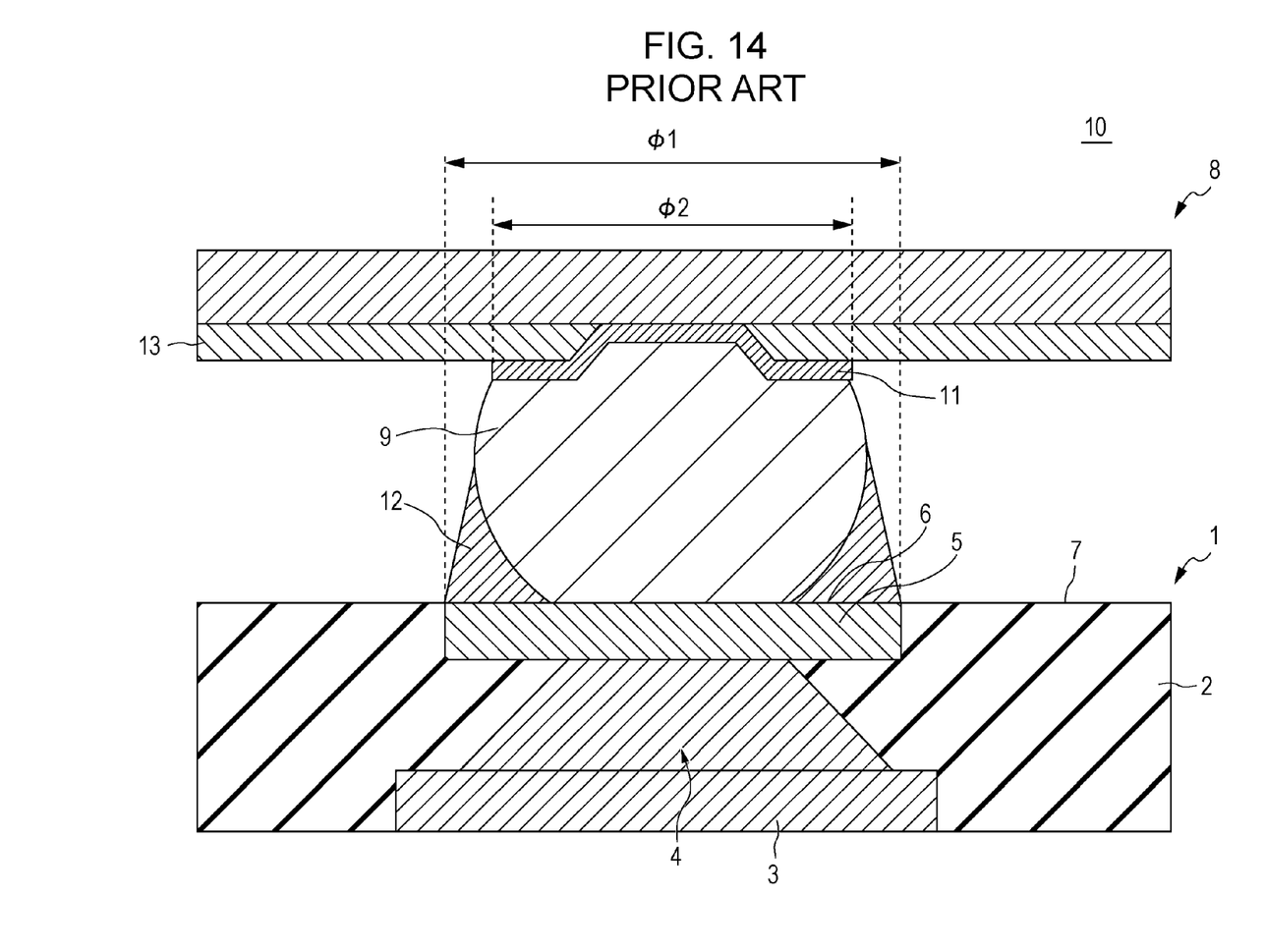
FIG. 14 is an enlarged cross-sectional view of the vicinity of a connecting pad of a coreless substrate of a related-art semiconductor package.

FIG. 14 is an enlarged cross-sectional view of the vicinity of a solder bump of a semiconductor package in which a semiconductor chip is mounted on a coreless substrate having no core substrate by the C4 technology. As shown in the drawing, the coreless substrate 1 includes a dielectric layer 2, a land 3, a via 4, and a connecting pad 5. The land 3 is shaped like a column (a thin disc) and is completely embedded in the dielectric layer 2. The connecting pad 5 is also a kind of land, shaped like a column (a thin disc), and is embedded in the dielectric layer 2, but the main surface 6 thereof is exposed at the main surface 7 of the dielectric layer 2. The via 4 is shaped like a truncated cone or a column, which is formed between the land 3 and the connecting pad 5 to electrically connect the land 3 and the connecting pad 5.

On the other hand, a semiconductor package 10 includes solder bumps 9 that constitute a bump array. A cushioning film 13 is formed on the bottom of a semiconductor chip 8 to absorb an impact applied on the solder bumps 9. Under bump metal (UBM) 11 is plated under the solder bumps 9 (between the solder bumps 9 and the bottom of the semiconductor chip 8).

The solder bumps 9 are mounted on the connecting pad 5, and solder 12, which is attached in advance, is melted to solder the solder bumps 9 to the connecting pad 5. Thus, the semiconductor chip 8 is mounted on the coreless substrate 1.

Here, the diameter $\phi1$ of the connecting pad 5 is about 95 µm, and the diameter $\phi2$ of the under bump metal 11 is about 75 µm, so that the diameter $\phi1$ of the connecting pad 5 is larger than the diameter $\phi2$ of the under bump metal 11. Therefore, if mechanical stress is applied in a direction in which the semiconductor chip 8 is separated from the coreless substrate 1, the stress concentrates onto the small-diameter under bump metal 11, from which rupture is prone to occur.

If the diameter $\phi1$ of the connecting pad 5 can be made equal to the diameter $\phi2$ of the under bump metal 11, mechanical stress may disperse evenly to both of the connecting pad 5 and the bump metal 11, which may reduce rupture. However, those diameters cannot be made equal because of the following reasons.

The under bump metal 11 should be formed at a pitch of about 150 µm. However, if the diameter $\phi2$ of the under bump metal 11 is increased, the distance from the adjacent under bump metals 11 decreases. This makes it difficult, in forming the under bump metals 11 by plate patterning, to remove unnecessary plate in the area other than the under bump metals 11, which reduces yields. On the other hand, it is also difficult to reduce the diameter $\phi1$ of the connecting pad 5. This is because the limit of the diameter $\phi1$ of the connecting pad 5 is 95 µm in consideration of the diameter of the via 4 and manufacturing tolerances of the position thereof.

Japanese Unexamined Patent Application Publication No. 2003-37135 (Patent Document 2) discloses a technology for a semiconductor device in which a semiconductor chip is mounted on a wiring board with bumps to ensure a predetermined height from the wiring board to the semiconductor chip (refer to Paragraph 0021 of Patent Document 2). The semiconductor chip is transported onto the wiring board and is bonded by aligning external terminals of the semiconductor chip and protruding conductors on the wiring board and performing thermocompression bonding. Solder balls are provided on the individual external terminals, with under bump metal therebetween, so that the height from the insulating substrate to the semiconductor chip after the solder balls are melted and bonded by thermocompression bonding can be increased by the height of the protruding conductors (refer to Paragraph 0055 of Patent Document 2). However, since the protruding conductors protrude from the wiring board, it is difficult to make the diameter of the joint surface between the external terminals of the semiconductor chip and the protruding conductors on the wiring board constant because of variations in the amount of the solder balls due to variations in manufacture, the mounting inclination of the semiconductor chip, and variations in mounting weight for the semiconductor chip.

Japanese Unexamined Patent Application Publication No. 10-242649 (Patent Document 3) discloses a multilayer printed wiring board having solder bumps (refer to FIGS. 19 and 20 of the gazette). This multilayer printed wiring board is provided with an electroless copper plating film and an electrolytic copper plating film, on which solder bumps are formed. This wiring board also has a solder resist thereon. However, portions where the copper plating films and the solder resist are stacked are protruded, and portions where no copper plating film is present and only the solder resist is present are recessed, so that the surface of the multilayer printed wiring board do not become flat. Therefore, underfill resin cannot be poured at a constant speed between the multilayer printed wiring board and the semiconductor chip mounted thereon.

Background information may also be found in [Patent Document 4] Japanese Unexamined Patent Application Publication No. 10-233417, and [Patent Document 5] Japanese Unexamined Patent Application Publication No. 2000-269271.

BRIEF SUMMARY OF THE INVENTION

An object of the present invention is to provide a printed wiring board and a semiconductor package in which solder bumps of a mounted semiconductor chip are less prone to be ruptured and a method for manufacturing the same.

A printed wiring board according to the present invention includes a dielectric layer having a main surface and a connecting pad embedded in the dielectric layer. The connecting pad includes a plate portion having a front surface and a back surface; and a contact portion located at the front surface of the plate portion, the contact portion having a main surface exposed at the main surface of the dielectric layer and being smaller than the plate portion.

According to the invention, the connecting pad is shaped like a brimmed hat, only the contact portion can be made small, thus allowing a semiconductor package having, for example, almost the same area (diameter) as the under bump metal of a mounted semiconductor chip to be manufactured. Thus, even if mechanical stress is applied in a direction in which the semiconductor chip is peeled off from the printed wiring board, the stress disperses evenly to both of the connecting pad and the under bump metal, thus bumps are less prone to be ruptured.

Preferably, the printed wiring board further includes a via embedded in the dielectric layer and in contact with the back surface of the plate portion. In this case, since the plate portion is larger than the via, a margin for aligning (positioning) the plate portion and the via is provided, thus ensuring connection with the via.

A method for manufacturing a printed wiring board according to the present invention includes the steps of preparing a base material; forming a first film having a first through-hole on the base material; forming a second film on the first film, the second film having a second through-hole located on the first through-hole and larger than the first through-hole; forming a connecting pad by filling metal into the first and second through-holes; removing the first and second films after forming the connecting pad; forming a dielectric layer so as to cover the base material and the connecting pad; and removing the base material after forming the dielectric layer.

The present invention facilitates manufacturing a printed wiring board having brimmed-hat-shaped connecting pads. Furthermore, the present invention allows a semiconductor package including the printed wiring board to be manufactured.

Following is a list of reference numbers being used in the above drawings:
3: land
4: via
7, 39: main surface
8: semiconductor chip
9: solder bump
10: semiconductor package
11: under bump metal
13: cushioning film
20: coreless substrate
22: build-up layer
24: connecting pad
26, 26a, 26b: dielectric layer
36: plate portion
38: contact portion
40: collar
42: base material
44, 54: resist film
46, 56: mask
48, 58: light-shielding portion
50, 60: through-hole
56: mask
66, 72: metal
68: insulating film
70: via-hole

DETAILED DESCRIPTION OF EMBODIMENTS OF THE INVENTION

Embodiments of the present invention will be described in detail below with reference to the drawings. In the drawings, like or corresponding parts are given like reference numerals and descriptions thereof will not be repeated.

Figure 1:
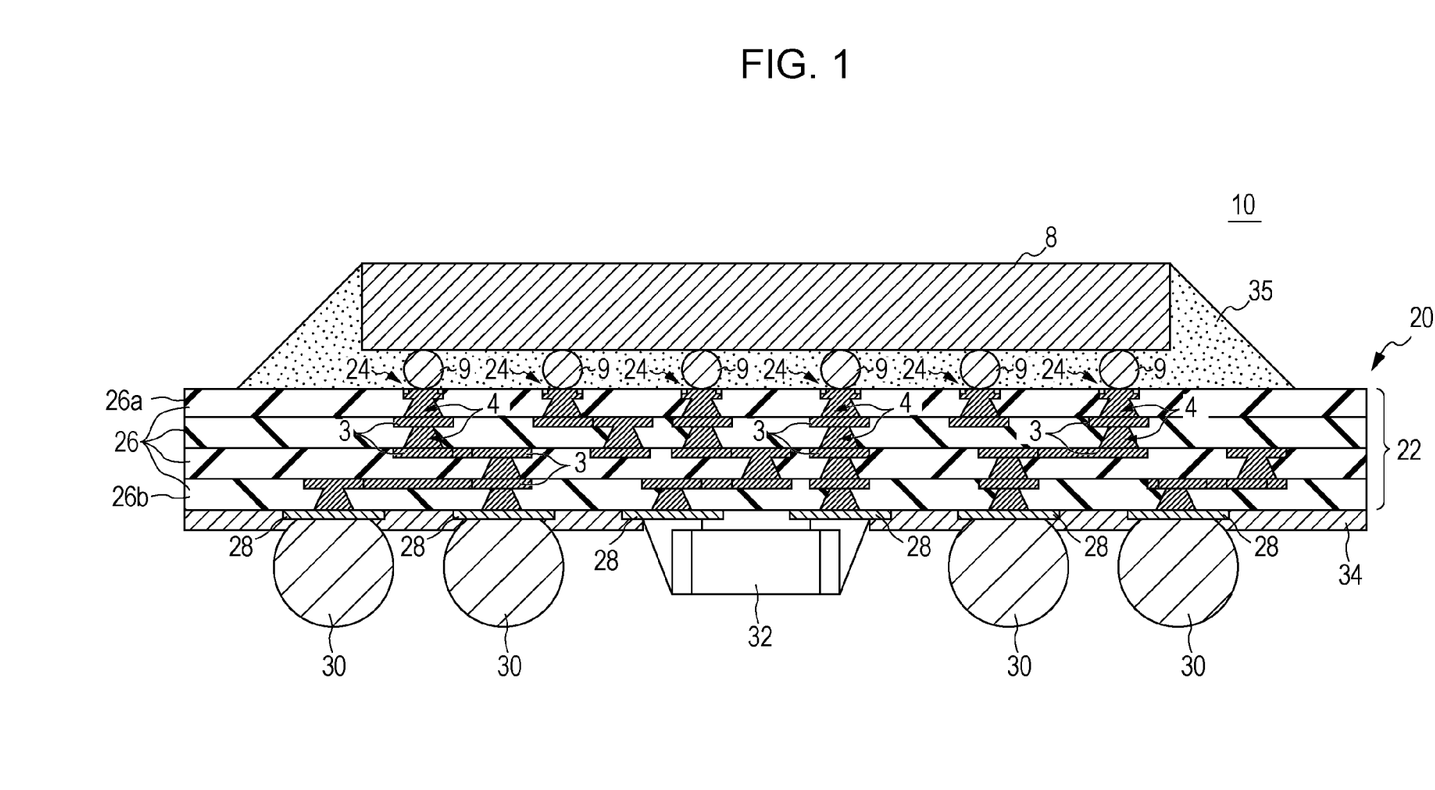
FIG. 1 is a cross-sectional view showing the entire structure of a semiconductor package according to an embodiment of the present invention.

Referring to FIG. 1, a semiconductor package 10 according to an embodiment of the present invention includes a coreless substrate 20 and a semiconductor chip 8 mounted on the coreless substrate 20. The coreless substrate 20 includes a build-up layer 22, a plurality of lands 3, a plurality of vias 4, and a plurality of connecting pads 24. The build-up layer 22 is formed a plurality of stacked dielectric layers 26. The lands 3 are shaped like a column (a thin disc) and are completely embedded in the dielectric layers 26, where they are connected to wiring layers in the dielectric layers 26. The vias 4 are shaped like a column or a truncated cone and are completely embedded in the dielectric layers 26. The vias 4 are each formed between the land 3 and the connecting pad 24 to serve as an interlayer connecting portion that electrically connects the land 3 and the connecting pad 24. The connecting pads 24 are embedded in an outermost dielectric layer 26a adjacent to the semiconductor chip 8. The details of the connecting pads 24 will be described later.

The coreless substrate 20 further includes connecting pads 28, a plurality of solder bumps 30, and a capacitor 32.

The connecting pads 28 are shaped like a column (a thin disc) and are formed on an outermost dielectric layer 26b opposite to the connecting pads 24. The solder bumps 30 are soldered to the connecting pads 28 to form ball grid array (BGA) terminals. The capacitor 32 is soldered to the connecting pads 28. A solder protection film (a solder resist) 34 is formed in the area other than the connecting pads 28 on the dielectric layer 26b.

Figure 2:
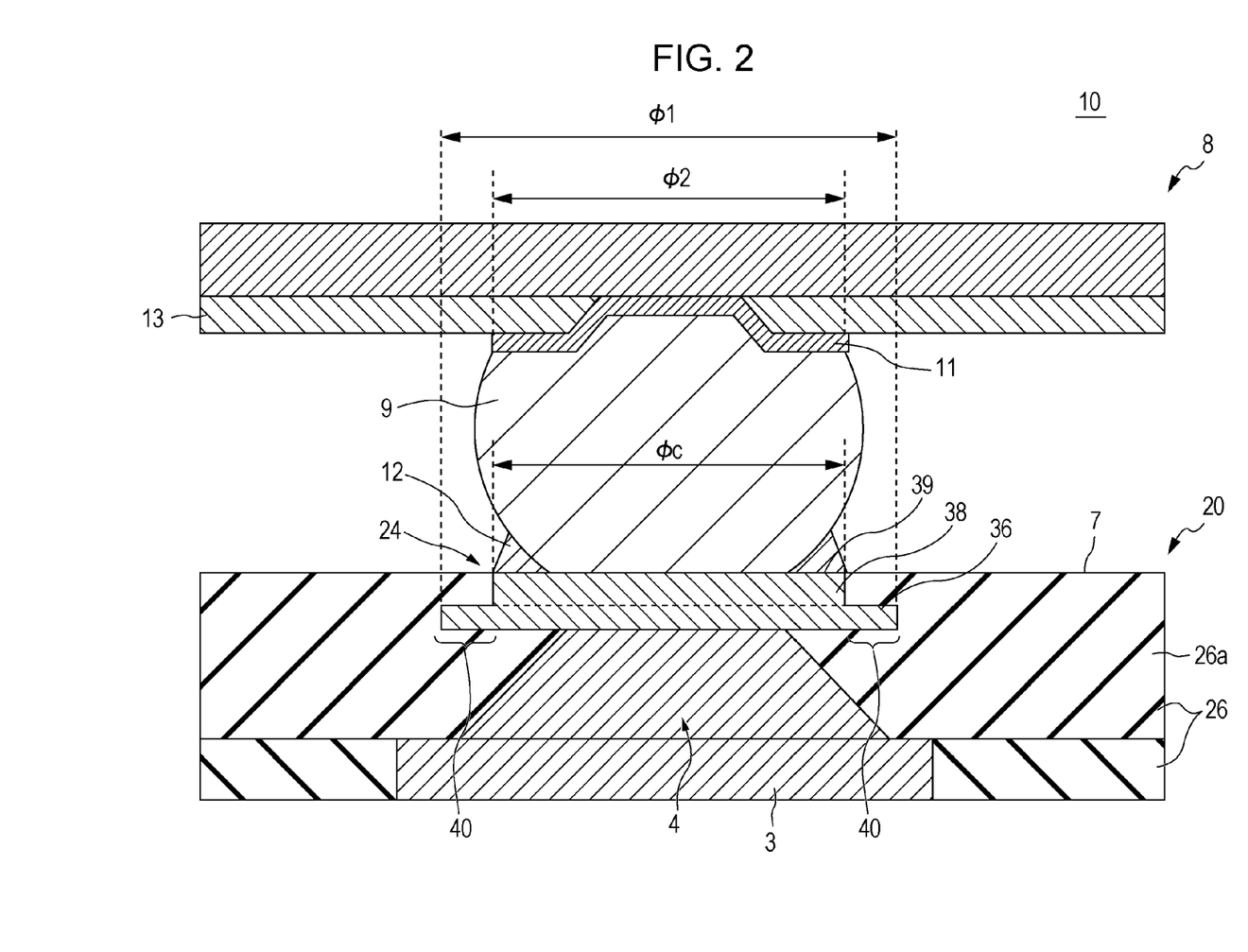
FIG. 2 is an enlarged cross-sectional view of the vicinity of a connecting pad of the semiconductor package shown in FIG. 1.

On the other hand, the semiconductor chip 8 includes solder bumps 9 that constitute a bump array. FIG. 2 is an enlarged cross-sectional view of the vicinity of the solder bump 9 of the semiconductor package 10. As shown in the drawing, a cushioning film 13 is formed on the bottom of the semiconductor chip 8 to absorb an impact applied to the solder bumps 9. Furthermore, under bump metal 11, made of titanium, chromium, or copper, is plated under the solder bumps 9 (between the solder bumps 9 and the bottom of the semiconductor chip 8).

Solder 12, which is attached on the connecting pads 24 in advance, is melted to solder the solder bumps 9 to the connecting pads 24. Thus, the semiconductor chip 8 is mounted on the coreless substrate 20. As shown in FIG. 1, an underfill resin 35 is filled between the semiconductor chip 8 and the coreless substrate 20.

While the related-art connecting pad 5 shown in FIG. 14 is shaped like a column, the connecting pad 24 is shaped like a brimmed hat. More specifically, the connecting pad 24 is formed of a plate portion 36 and a contact portion 38. The plate portion 36 is shaped like a column (a thin disc), whose diameter $\phi1$ is about 95 μm, the same as the diameter $\phi1$ of the related-art connecting pad 5, and whose thickness is about 10 μm. The contact portion 38 is shaped like a column (a thin disc), whose diameter $\phi c$ is about 75 μm, which is smaller than the diameter $\phi1$ of the plate portion 36 and is substantially equal to the diameter $\phi2$ of the under bump metal 11, and whose thickness is about 20 μm. The contact portion 38 is located on the front surface of the plate portion 36. The main surface 39 of the contact portion 38 is exposed at the main surface 7 of the dielectric layer 26a. The main surface 39 of the contact portion 38 and the main surface 7 of the dielectric layer 26a are in the same plane. The plate portion 36 and the contact portion 38 are coaxially and integrally formed. Therefore, the connecting pad 24 has a collar 40 corresponding to the brim of the hat. The collar 40 is shaped like a ring with a width of about 10 μm. The via 4 is in contact with the back of the plate portion 36.

According to this embodiment, the diameter $\phi c$ of the contact portion 38 is substantially equal to the diameter $\phi2$ of the under bump metal 11. Therefore, even if mechanical stress is applied in a direction in which the semiconductor chip 8 is peeled off from the coreless substrate 20, the stress disperses evenly to both of the connecting pads 24 and the under bump metal 11, causing little rupture. Moreover, not the diameter of the connecting pad 24 is set small but only the diameter $\phi c$ of the contact portion 38 is set small and the diameter $\phi1$ of the plate portion 36 is not set small, maintained at about 95 μm. Therefore, the position of the via 4 does not deviate from the position of the connecting pad 24 by a large amount even in consideration of the diameter of the via 4 and the manufacturing tolerances of the position thereof, thus ensuring connection of the via 4 and the connecting pad 24. On the other hand, the diameter $\phi2$ of the under bump metal 11 is maintained at about 75 μm without being increased, which does not reduce yields when forming the under bump metal 11 by plate patterning.

Since the connecting pad 24 has the collar 40, even if mechanical stress is applied in a direction in which the semiconductor chip 8 is peeled off from the coreless substrate 20, the collar 40 is caught or trapped in the dielectric layer 26a, so that the connecting pad 24 is hardly broken. Since the main surface 39 of the contact portion 38 and the main surface 7 of the dielectric layer 26a are in the same plane, so that the main surface of the entire coreless substrate 20 is flat, the underfill resin 35 flows between the semiconductor chip 8 and the coreless substrate 20 at a constant speed.

Next, one example of a method for manufacturing the coreless substrate 20 having the plurality of dielectric layers 26 will be described. The build-up layer 22 is formed downward in FIG. 1, as follows.

Figure 3:
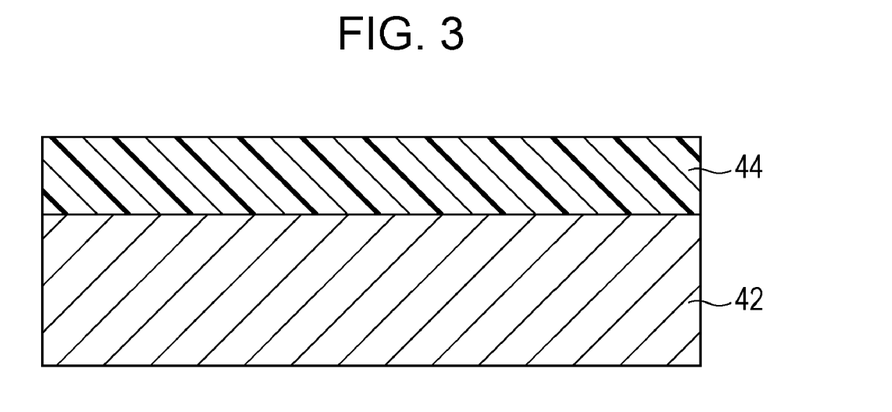
FIG. 3 is a cross-sectional view showing the first process of a method for manufacturing the coreless substrate shown in FIG. 1.

As shown in FIG. 3, first, a base material 42 made of a copper plate is prepared, and a negative resist film 44 is applied on the base material 42.

Figure 4:
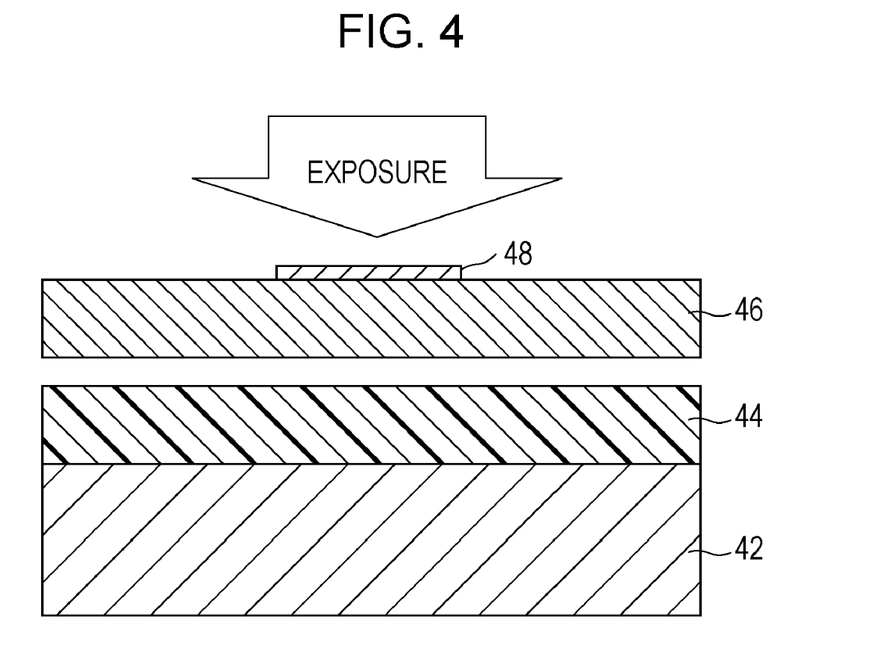
FIG. 4 is a cross-sectional view showing a process next to the process shown in FIG. 3.

Next, as shown in FIG. 4, the resist film 44 is covered with a mask 46 having a predetermined pattern using photolithography and is exposed with light for a predetermined time. Although a part of the resist film 44 shielded by a light-shielding portion 48 of the mask 46 is not irradiated with light, the other part is irradiated with light. The light-shielding portion 48 is shaped like a circle, whose diameter is about 75 μm.

Figure 5:
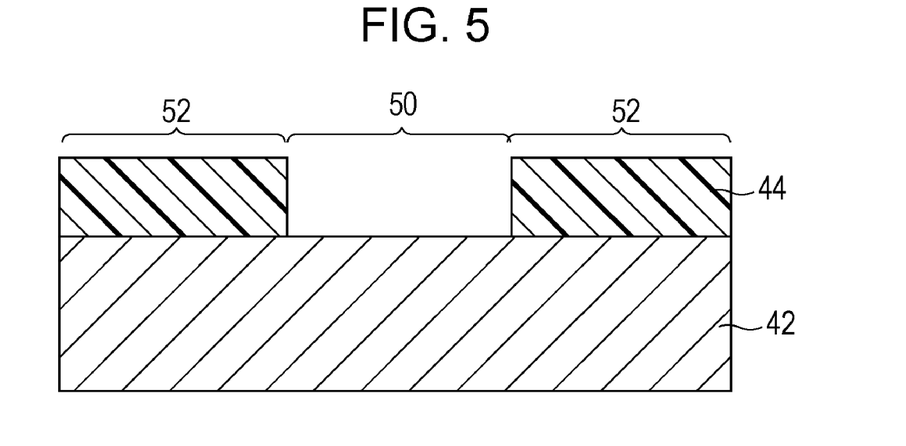
FIG. 5 is a cross-sectional view showing a process next to the process shown in FIG. 4.

Next, as shown in FIG. 5, when the resist film 44 is developed and cleaned, only the part that is not irradiated with light is removed to form a through-hole 50, which is a resist groove, and only an irradiated portion 52 is left. Thus, the resist film 44 is patterned.

Figure 6:
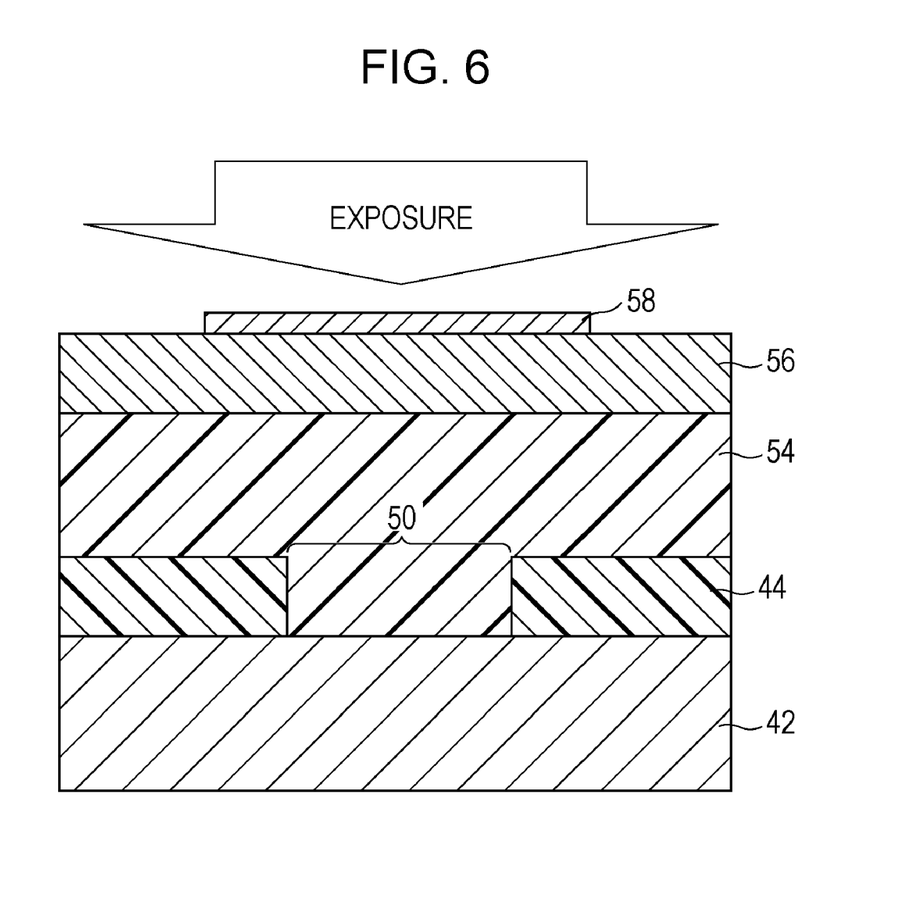
FIG. 6 is a cross-sectional view showing a process next to the process shown in FIG. 5.

Next, substantially the same processes as those shown in FIGS. 3 and 4 are repeated. That is, as shown in FIG. 6, a resist film 54 made of the same material is put on the patterned resist film 44. The resist film 54 is then covered with a mask 56 having a different pattern from that of the mask 46 and is exposed with light for a predetermined time. Although a part of the resist film 54 shielded by a light-shielding portion 58 is not irradiated with light, the other part is irradiated with light. The light-shielding portion 58 is shaped like a circle, whose diameter is about 95 μm. In this process, the mask 56 is aligned or positioned so that the center of the light-shielding portion 58 substantially coincides with the center of the through-hole 50 (the position of the center of the light-shielding portion 48 in the process shown in FIG. 4).

Figure 7:
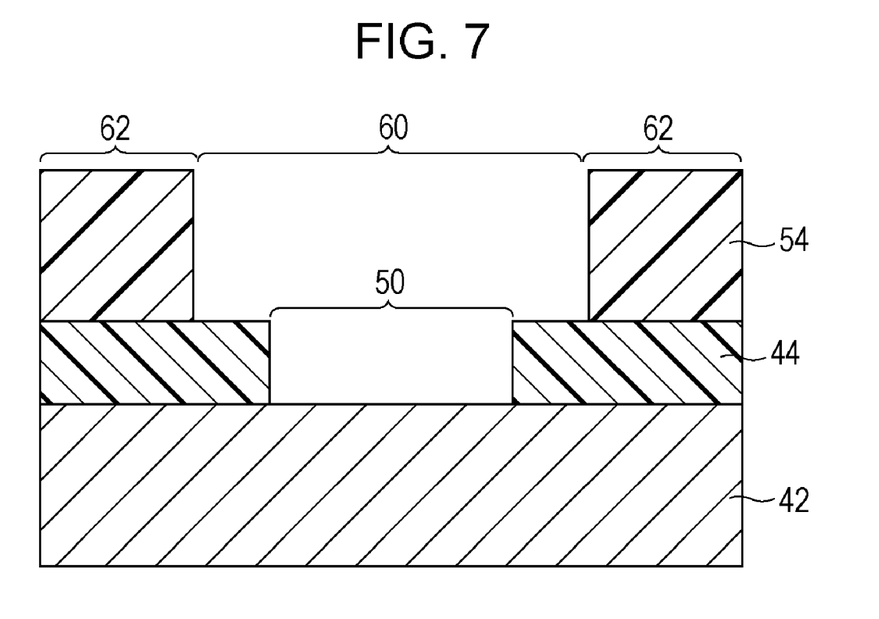
FIG. 7 is a cross-sectional view showing a process next to the process shown in FIG. 6.

Next, as shown in FIG. 7, when the resist film 54 is developed and cleaned, only the part that is not irradiated with light is removed to form a through-hole 60, which is a resist groove, and only an irradiated portion 62 is left. Thus, the resist film 54 is patterned. As a result, the cylindrical through-hole 60 is formed on the cylindrical through-hole 50.

Figure 8:
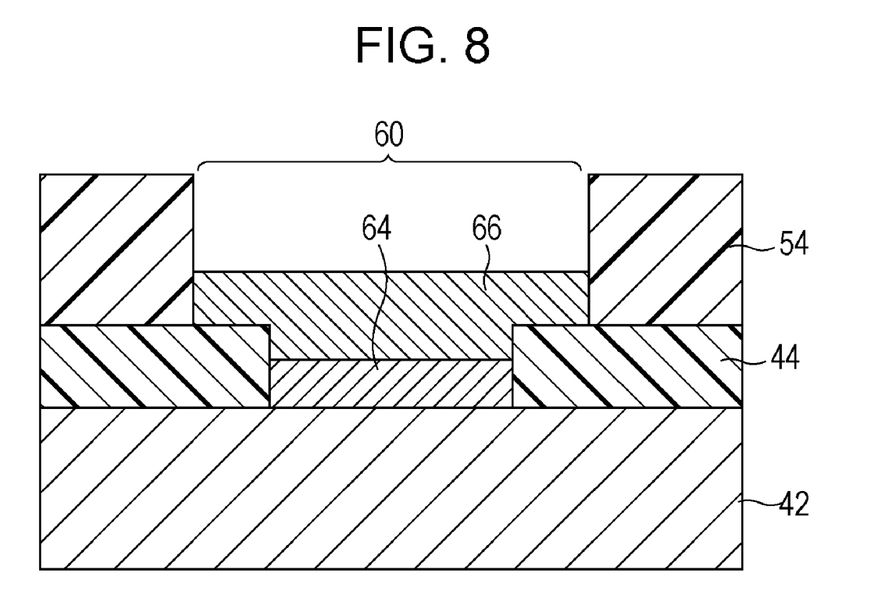
FIG. 8 is a cross-sectional view showing a process next to the process shown in FIG. 7.

Next, as shown in FIG. 8, barrier metal 64, such as gold, is plated in the through-hole 50 on the base material 42, and furthermore, metal 66, such as copper, is plated in the through-holes 50 and 60 on the barrier metal 64. The barrier metal 64 serves as an etching stopper in the later process of removing the base material 42 by etching.

Figure 9:
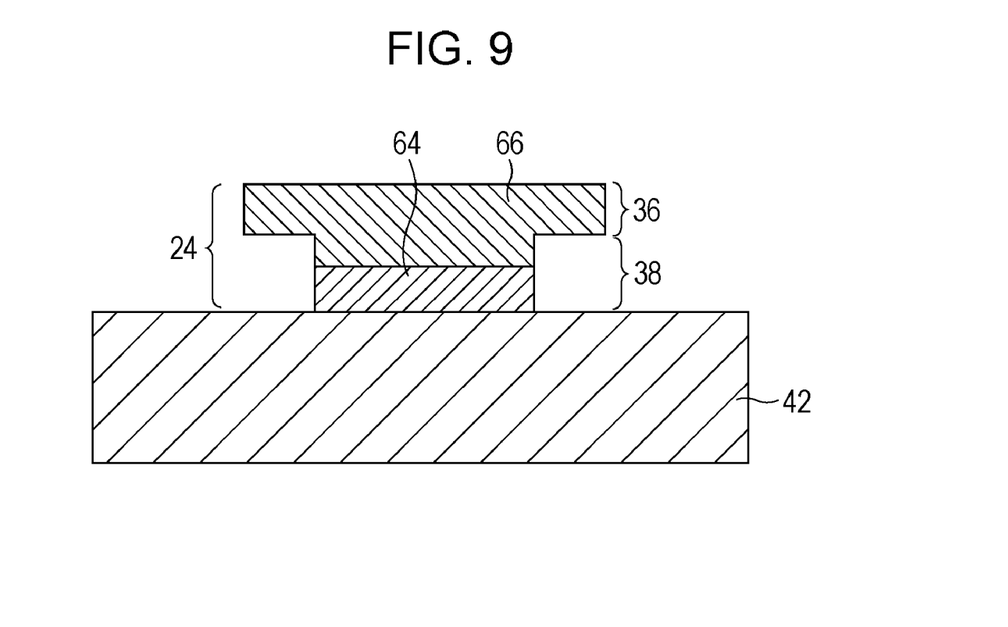
FIG. 9 is a cross-sectional view showing a process next to the process shown in FIG. 8.

Next, as shown in FIG. 9, the resist films 44 and 54 are stripped (peeled off) by a conventional stripping process. Thus, the above-described hat-shaped connecting pad 24 formed of the plate portion 36 and the contact portion 38 is formed.

Figure 10:
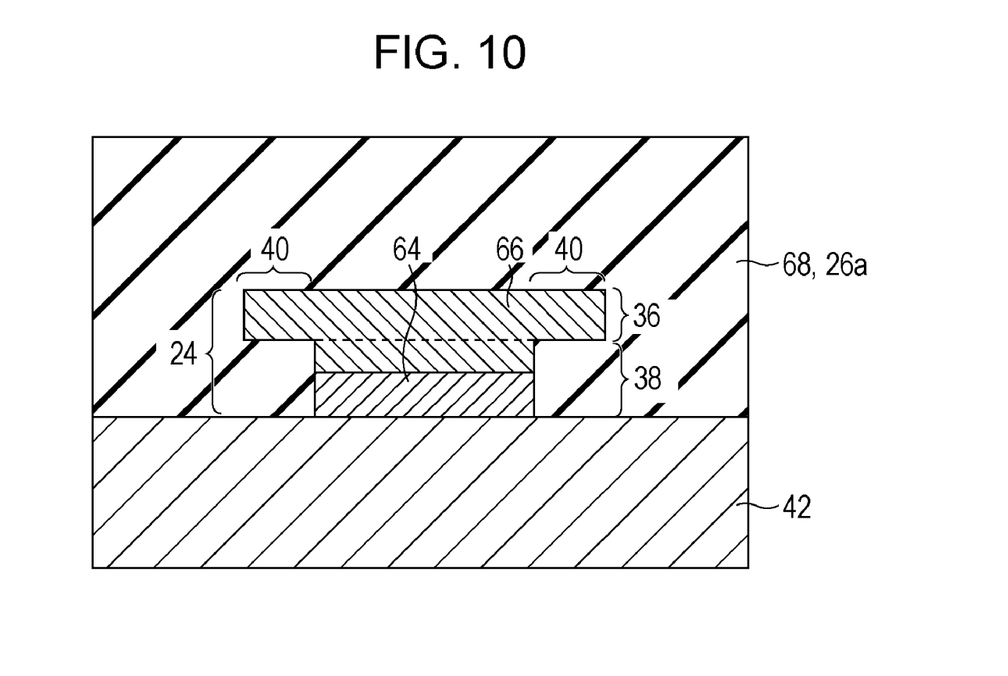
FIG. 10 is a cross-sectional view showing a process next to the process shown in FIG. 9.

Next, as shown in FIG. 10, an insulating film 68 is laminated. Since this process is performed in a vacuum, the insulating film 68 comes below the collar 40. Thus, the above-described dielectric layer 26a (the insulating film 68) is formed.

Figure 11:
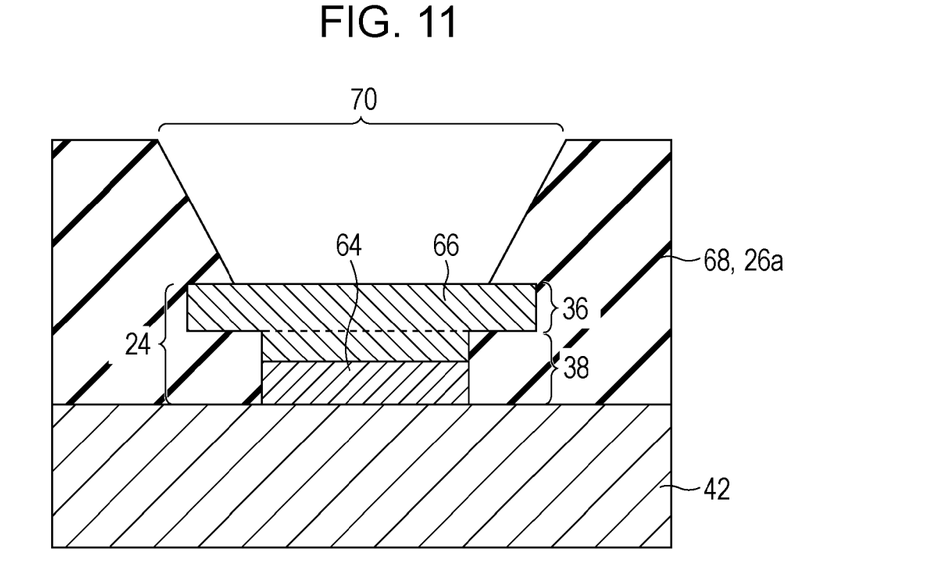
FIG. 11 is a cross-sectional view showing a process next to the process shown in FIG. 10.

Next, as shown in FIG. 11, a via-hole 70 is formed in the insulating film 68 (the dielectric layer 26a) directly above the plate portion 36 by a laser.

Figure 12:
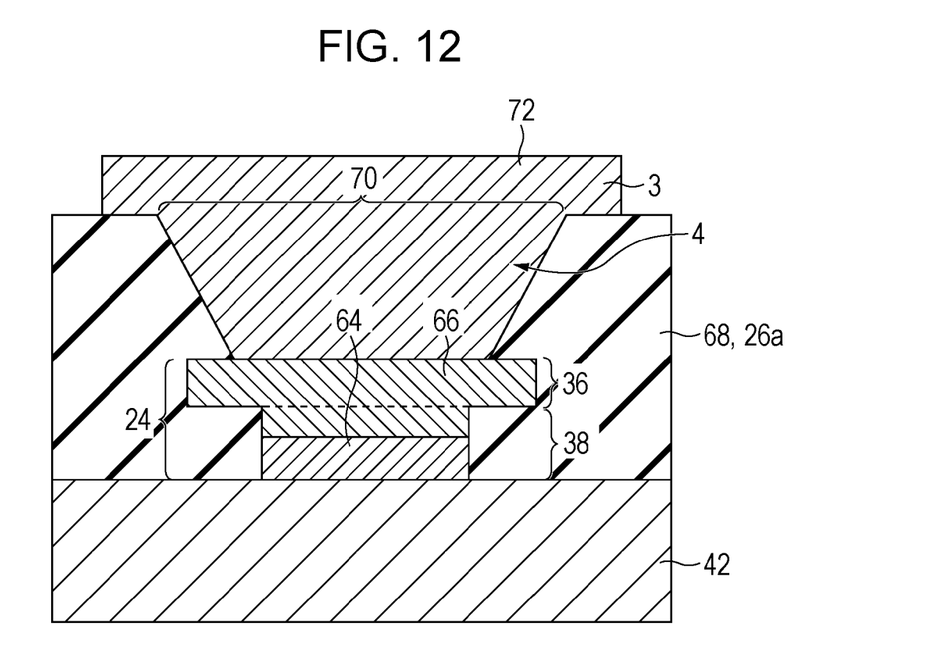
FIG. 12 is a cross-sectional view showing a process next to the process shown in FIG. 11.

Next, as shown in FIG. 12, metal 72, such as copper, is plated on the insulating film 68, in which the via-hole 70 is formed, to form a pattern. Thus, the metal 72 that fills the via-hole 70 forms the above-described via 4, and the metal 72 patterned on the via hole 70 and the insulating film 68 constitutes the above-described land 3. The land 3 is connected to a wiring layer in a dielectric layer formed next.

Likewise, by repetition of the process of laminating an insulating film, the process of forming a via-hole by a laser, and the process of plating metal, the plurality of dielectric layers 26 is formed to form the build-up layer 22 shown in FIG. 1. The process of forming the build-up layer 22 is well known.

Figure 13:
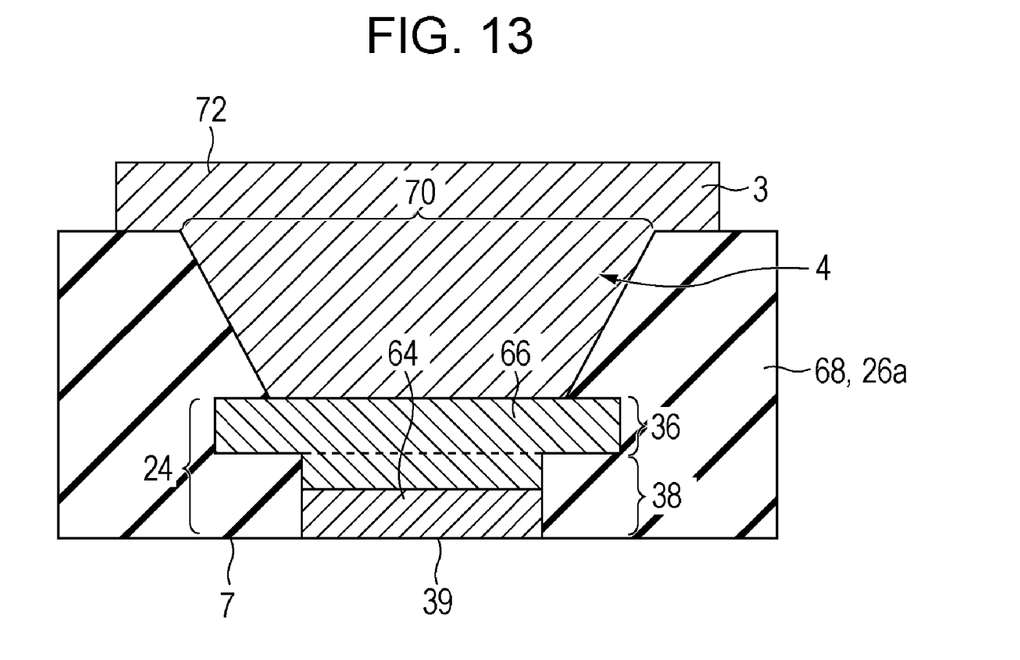
FIG. 13 is a cross-sectional view showing a process next to the process shown in FIG. 12.

Last, as shown in FIG. 13, the copper base material 42 is removed by etching. Since the barrier metal 64, such as gold, is not etched at that time, the metal 66, such as copper, is not etched. Therefore, the main surface 39 of the contact portion 38 and the main surface 7 of the dielectric layer 26a are formed in the same plane.

This manufacturing method facilitates manufacturing the coreless substrate 20 having the hat-shaped connecting pads 24.

The dimensions described above are merely examples, and the present invention is not limited to those. For example, the diameter of the contact portion 38 may not be exactly the same as the diameter of the under bump metal 11 of the semiconductor chip 8 and may be about 70 to 80 μm. For example, the area of the contact portion 38 and the area of the under bump metal 11 may be substantially equal. The diameter of the plate portion 36 may be about 90 to 100 μm, or may be considerably larger than 95 μm.

Although the connecting pad 24 of the above embodiment is configured such that the center of the disc-shaped plate portion 36 and the center of the disc-shaped contact portion 38 coincide with each other, they may not exactly coincide with each other but may slightly deviate from each other. The connecting pad 24 may not be formed of two separate members, the plate portion 36 and the contact portion 38, but may only be of a hat shape with a collar as a whole. Although the plate portion 36 and the contact portion 38 are circular in plan view, they may not be limited to that but may be elliptic or polygonal in shape.

Although the manufacturing method according to the above embodiment forms the barrier metal 64 on the base material 42, the barrier metal 64 may be omitted, and the metal 66, such as copper, may be formed directly on the base material 42.

Although the embodiment is the coreless substrate 20, the invention is not limited to that but may be applied also to a general printed wiring board having a core substrate.

Although the invention has been described on the basis of an embodiment, the embodiment is merely an example for embodying the invention. Accordingly, it is to be understood that the invention is not limited the above embodiment, and various modifications may be made without departing from the spirit and scope of the claims.

What is claimed is:

1. A printed wiring board, comprising:
a dielectric layer having a main surface; and
a connecting pad embedded in the dielectric layer, wherein the connecting pad includes:
    a plate portion having a front surface and a back surface; and
    a contact portion located at the front surface of the plate portion, the contact portion having a top surface that is coplanar with the main surface of the dielectric layer and is smaller than the plate portion,
wherein the plate portion is in a thin disc shape; the contact portion is in a thin disc shape having a diameter that is smaller than a diameter of the plate portion; and the plate portion and the contact portion are coaxially and formed integrally from a same material.

2. The printed wiring board according to claim 1, further comprising a via embedded in the dielectric layer and in contact with the back surface of the plate portion.

3. The printed wiring board according to claim 1, wherein the connecting pad embedded in the dielectric layer has a top surface that is no higher than the main surface of the dielectric layer.

4. A semiconductor package including a printed wiring board and a semiconductor chip mounted on the printed wiring board, wherein the printed wiring board comprises:
a dielectric layer having a main surface; and
a connecting pad embedded in the dielectric layer; wherein the connecting pad includes:
    a plate portion having a front surface and a back surface; and
    a contact portion located at the front surface of the plate portion, the contact portion having a top surface being coplanar with the main surface of the dielectric layer and being smaller than the plate portion,
wherein the plate portion and the contact portion are both in a column shape and are coaxially and integrally formed from a same material;
wherein the semiconductor chip comprises:
    a solder bump; and
    an under bump metal underlying the solder bump; and
    wherein the diameter of the contact portion is substantially equal to the diameter of the under bump metal.

5. The printed wiring board according to claim 4, wherein the connecting pad embedded in the dielectric layer has a top surface that is coplanar with the main surface of the dielectric layer.

* * * * *